United States Patent
Fisher et al.

(10) Patent No.: US 12,191,821 B2
(45) Date of Patent: Jan. 7, 2025

(54) GROUP III NITRIDE-BASED MONOLITHIC MICROWAVE INTEGRATED CIRCUITS HAVING MULTI-LAYER METAL-INSULATOR-METAL CAPACITORS

(71) Applicant: MACOM Technology Solutions Holdings, Inc., Lowell, MA (US)

(72) Inventors: Jeremy Fisher, Raleigh, NC (US); Dan Namishia, Wake Forest, NC (US); Scott Sheppard, Chapel Hill, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 512 days.

(21) Appl. No.: 17/688,952

(22) Filed: Mar. 8, 2022

(65) Prior Publication Data
US 2023/0291367 A1 Sep. 14, 2023

(51) Int. Cl.
 *H03F 3/195* (2006.01)
 *H01L 23/66* (2006.01)
 *H03F 1/56* (2006.01)

(52) U.S. Cl.
 CPC ............. *H03F 3/195* (2013.01); *H01L 23/66* (2013.01); *H03F 1/565* (2013.01); *H01L 2223/6655* (2013.01); *H03F 2200/451* (2013.01)

(58) Field of Classification Search
 CPC .... H03F 3/195; H03F 1/565; H03F 2200/451; H01L 23/66; H01L 2223/6655
 USPC ........................................................ 330/286
 See application file for complete search history.

(56) References Cited

U.S. PATENT DOCUMENTS

| 8,253,218 | B2 | 8/2012 | Bito | |
| 2011/0193191 | A1* | 8/2011 | Bito | H01L 29/88 257/513 |
| 2021/0234516 | A1* | 7/2021 | Schultz | H03F 1/523 |
| 2021/0313935 | A1 | 10/2021 | Noori et al. | |
| 2021/0391891 | A1* | 12/2021 | Jin | H01L 23/66 |

(Continued)

FOREIGN PATENT DOCUMENTS

JP H0247862 A 2/1990

OTHER PUBLICATIONS

Notification of Transmittal of the International Search Report and the Written Opinion of the International Searching Authority, or the Declaration for corresponding International Application No. PCT/US2023/014007, mailing date: Aug. 11, 2023, (10 pages).

*Primary Examiner* — Hafizur Rahman
(74) *Attorney, Agent, or Firm* — Myers Bigel, P.A.

(57) ABSTRACT

Semiconductor devices are provided that include a Group III nitride-based semiconductor layer structure. A first metal layer is formed on an upper surface of the semiconductor layer structure, a first dielectric layer is formed on an upper surface of the first metal layer, and a second metal layer is formed on an upper surface of the first dielectric layer. The first metal layer, the first dielectric layer and the second metal layer form a first capacitor. A second dielectric layer is formed on an upper surface of the second metal layer, a third dielectric layer is formed on an upper surface of the second dielectric layer, and a third metal layer is formed on upper surfaces of the second and third dielectric layers. The second metal layer, the second dielectric layer and the third metal layer form a second capacitor that is stacked on the first capacitor.

21 Claims, 7 Drawing Sheets

(56) References Cited

U.S. PATENT DOCUMENTS

2022/0140794 A1* 5/2022 Brewer .................. H03F 3/195
　　　　　　　　　　　　　　　　　　　　　　　　330/295
2023/0291367 A1* 9/2023 Fisher .................... H01L 23/66

* cited by examiner

GROUP III NITRIDE-BASED MONOLITHIC MICROWAVE INTEGRATED CIRCUITS HAVING MULTI-LAYER METAL-INSULATOR-METAL CAPACITORS

FIELD

The present invention relates to microelectronic devices and, more particularly, to monolithic microwave integrated circuit ("MMIC") devices that include capacitors.

BACKGROUND

Electrical circuits requiring high power handling capability while operating at various radio frequencies ("RF"), such as, for example, R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now high demand for RF transistor amplifiers that are used to amplify RF signals at frequencies of, for example, 500 MHz. These RF transistor amplifiers often need to exhibit high reliability, good linearity and handle high output power levels.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may include one or more amplification stages. When multiple amplification stages are provided, they may be connected in series and/or in parallel.

High power RF transistor amplifiers are now typically implemented in wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements. Group III nitride-based RF transistor amplifiers are typically implemented as High Electron Mobility Transistors ("HEMT"). In many cases, such Group III-nitride based RF transistor amplifiers are implemented in gallium nitride based semiconductor epitaxial layers that are formed on a silicon carbide substrate.

RF transistor amplifiers often include matching circuits, such as impedance matching circuits and/or harmonic termination circuits. As known in the art, an impedance matching circuit refers to an electrical circuit that is designed to improve the impedance match (for RF signals at the fundamental operating frequency of the amplifier) between two components in order to reduce reflections at the junction between the two components and hence improve the return loss performance of the device. Harmonic termination circuits refer to circuits are designed to at least partly terminate to ground harmonics of the fundamental RF signal that may be generated during device operation, such as second and third order harmonics. Impedance matching and/or harmonic termination circuits may be provided at the input and/or output of an RF transistor amplifier, and may also be provided between amplification stages when the RF transistor amplifier includes more than one amplification stage.

In many cases, RF transistor amplifiers may be implemented as stand alone devices. However, in other cases, the above-discussed impedance matching and/or harmonic termination circuitry may be implemented on the same semiconductor die or "chip" as the RF transistor amplifier to provide a monolithic microwave integrated circuit ("MMIC"). A MMIC refers to an integrated circuit that operates on RF signals (which are also referred to herein as microwave frequency signals) in which all of the circuitry for a particular function is integrated into a single semiconductor chip. An example MMIC device is an RF transistor amplifier that includes associated impedance matching circuits, harmonic termination circuits, feed networks, bias voltage networks and the like that are all implemented on a common substrate. MMIC RF transistor amplifiers typically include a plurality of unit cell HEMT transistors that are electrically connected in parallel.

SUMMARY

Pursuant to embodiments of the present invention, semiconductor devices are provided that comprise a Group III nitride based semiconductor layer structure; a first metal layer that is directly on an upper surface of the Group III nitride based semiconductor layer structure; a first dielectric layer that is directly on an upper surface of the first metal layer; a second metal layer that is directly on an upper surface of the first dielectric layer; a second dielectric layer that is directly on an upper surface of the second metal layer; a third dielectric layer that is on an upper surface of the second dielectric layer; and a third metal layer that is directly on an upper surface of the second dielectric layer and directly on an upper surface of the third dielectric layer, wherein the first metal layer, the first dielectric layer and the second metal layer form a first capacitor, and the second metal layer, the second dielectric layer and the third metal layer form a second capacitor that is stacked on top of the first capacitor In some embodiments, the third metal layer fills an opening in the third dielectric layer, the opening defining a surface area of the second capacitor.

In some embodiments, the third dielectric layer further extends onto side surfaces of the second dielectric layer.

In some embodiments, the second dielectric layer and the third dielectric layer both cover an upper edge of the second metal layer.

In some embodiments, the semiconductor device of claim 1, further comprising an electrical connection between the first metal layer and the third metal layer that connects the first capacitor and the second capacitor in parallel. In some embodiments, the electrical connection between the first metal layer and the third metal layer comprises a first opening in the first dielectric layer and a second opening in the second dielectric layer that vertically overlaps the first opening, where the third metal layer extends through the first and second openings to contact the first metal layer.

In some embodiments, the first capacitor and the second capacitor are electrically connected in series.

In some embodiments, a thickness of a portion of the first dielectric layer that is part of the first capacitor differs from a thickness of portion of the second dielectric layer that is part of the second capacitor.

In some embodiments, the semiconductor device is a monolithic microwave integrated circuit that includes a planar radio frequency ("RF") transistor amplifier and a matching circuit. In some embodiments, gate fingers and a gate bus of the RF transistor amplifier are part of the first metal layer. In some embodiments, drain fingers and a drain bus of the RF transistor amplifier are part of the second metal layer. In some embodiments, source fingers of the RF transistor amplifier are also part of the second metal layer. In some embodiments, at least one inductor of the matching circuit is part of the second metal layer. In some embodiments, an input feed network for the RF transistor amplifier is part of the second metal layer. In some embodiments, a gate jumper of the RF transistor amplifier is part of the third metal layer.

In some embodiments, the semiconductor device further comprises a fourth dielectric layer directly on an upper surface of the third metal layer and a fourth metal layer that is directly on an upper surface of the fourth dielectric layer, where the third metal layer, the fourth dielectric layer and the fourth metal layer form a third capacitor that is stacked on top of the second capacitor.

In some embodiments, the first metal layer is directly on an upper surface of the Group III nitride semiconductor layer structure.

In some embodiments, the first metal layer and the second metal layer include different compositions of one or more metals.

Pursuant to further embodiments of the present invention, RF transistor amplifiers are provided that comprise a Group III nitride based semiconductor layer structure; a first metal layer that is on an upper surface of the Group III nitride based semiconductor layer structure, where a plurality of gate fingers of the RF transistor amplifier and a lower electrode of a first capacitor are part of the first metal layer; a first dielectric layer that is directly on an upper surface of the first metal layer; a second metal layer that is directly on an upper surface of the first dielectric layer, where a plurality of drain fingers of the RF transistor amplifier and an upper electrode of the first capacitor that also serves as a lower electrode of a second capacitor are part of the second metal layer; a second dielectric layer that is directly on an upper surface of the second metal layer; and a third metal layer that is directly on an upper surface of the second dielectric layer, wherein an upper electrode of the second capacitor is part of the third metal layer. The second capacitor is stacked on top of the first capacitor to form a multi-layer capacitor structure.

In some embodiments, the first metal layer and the second metal layer include different compositions of one or more metals. In some embodiments, source fingers of the RF transistor amplifier are also part of the second metal layer. In some embodiments, the RF transistor amplifier further comprises a matching circuit. At least one inductor of the matching circuit may be part of the second metal layer. In some embodiments, an input feed network for the RF transistor amplifier is part of the second metal layer. In some embodiments, a gate jumper of the RF transistor amplifier is part of the third metal layer.

In some embodiments, the RF transistor amplifier may further comprise a third dielectric layer that is formed directly on an upper surface and a side surface of the second dielectric layer, the third dielectric layer including an opening that defines a surface area of the second capacitor. In some embodiments, the third metal layer fills the opening in the third dielectric layer. In some embodiments, the second dielectric layer and the third dielectric layer both cover an upper edge of the second metal layer.

In some embodiments, the RF transistor amplifier may further comprise an electrical connection between the first metal layer and the third metal layer that connects the first capacitor and the second capacitor in parallel. In some embodiments, the electrical connection between the first metal layer and the third metal layer comprises a first opening in the first dielectric layer and a second opening in the second dielectric layer that vertically overlaps the first opening, where the third metal layer extends through the first and second openings to contact the first metal layer.

In some embodiments, a thickness of a portion of the first dielectric layer that is part of the first capacitor differs from a thickness of portion of the second dielectric layer that is part of the second capacitor.

In some embodiments, the RF transistor amplifier may further comprise a fourth dielectric layer directly on an upper surface of the third metal layer and a fourth metal layer that is directly on an upper surface of the fourth dielectric layer, wherein the third metal layer, the fourth dielectric layer and the fourth metal layer form a third capacitor that is stacked on top of the second capacitor.

In some embodiments, the RF transistor amplifier is implemented as a monolithic microwave integrated circuit.

Pursuant to further embodiments of the present invention, semiconductor devices are provided that comprise a first metal layer that is on an upper surface of the Group III nitride based semiconductor layer structure, wherein a lower electrode of a first capacitor is part of the first metal layer; a first dielectric layer that is directly on an upper surface of the first metal layer; a second metal layer that is directly on an upper surface of the first dielectric layer, wherein an upper electrode of the first capacitor that also serves as a lower electrode of the second capacitor is part of the second metal layer; a second dielectric layer that is directly on an upper surface of the second metal layer, the second dielectric layer having a stepped upper surface and at least one sidewall connecting adjacent portions of the stepped upper surface; a third dielectric layer directly on the sidewall of the second dielectric layer; and a third metal layer that is directly on an upper surface of the second dielectric layer and directly on an upper surface of the third dielectric layer, wherein an upper electrode of the second capacitor is part of the third metal layer. The third dielectric layer is stacked directly on the upper surface of the second dielectric layer and the second dielectric layer is stacked directly on the upper surface of the first dielectric layer adjacent a sidewall of the second metal layer.

In some embodiments, the third metal layer fills an opening in the third dielectric layer, the opening defining a surface area of the second capacitor. In some embodiments, the second dielectric layer and the third dielectric layer both cover an upper edge of the second metal layer.

In some embodiments, the semiconductor device may further comprise an electrical connection between the first metal layer and the third metal layer that connects the first capacitor and the second capacitor in parallel.

In some embodiments, a thickness of a portion of the first dielectric layer that is part of the first capacitor differs from a thickness of portion of the second dielectric layer that is part of the second capacitor.

In some embodiments, the semiconductor device is monolithic microwave integrated circuit that includes a planar RF transistor amplifier and a matching circuit, and wherein gate fingers and a gate bus of the RF transistor amplifier are part of the first metal layer. In some embodiments, drain fingers, a drain bus and source fingers of the RF transistor amplifier are part of the second metal layer. In some embodiments, at least one inductor of the matching circuit is part of the second metal layer. In some embodiments, an input feed network for the RF transistor amplifier is part of the second metal layer. In some embodiments, a gate jumper of the RF transistor amplifier is part of the third metal layer.

In some embodiments, the first metal layer and the second metal layer include different compositions of one or more metals.

In some embodiments, the semiconductor device may further comprise a fourth dielectric layer directly on an upper surface of the third metal layer and a fourth metal layer that is directly on an upper surface of the fourth dielectric layer, wherein the third metal layer, the fourth dielectric layer and the fourth metal layer form a third capacitor that is stacked on top of the second capacitor.

Figure 1:
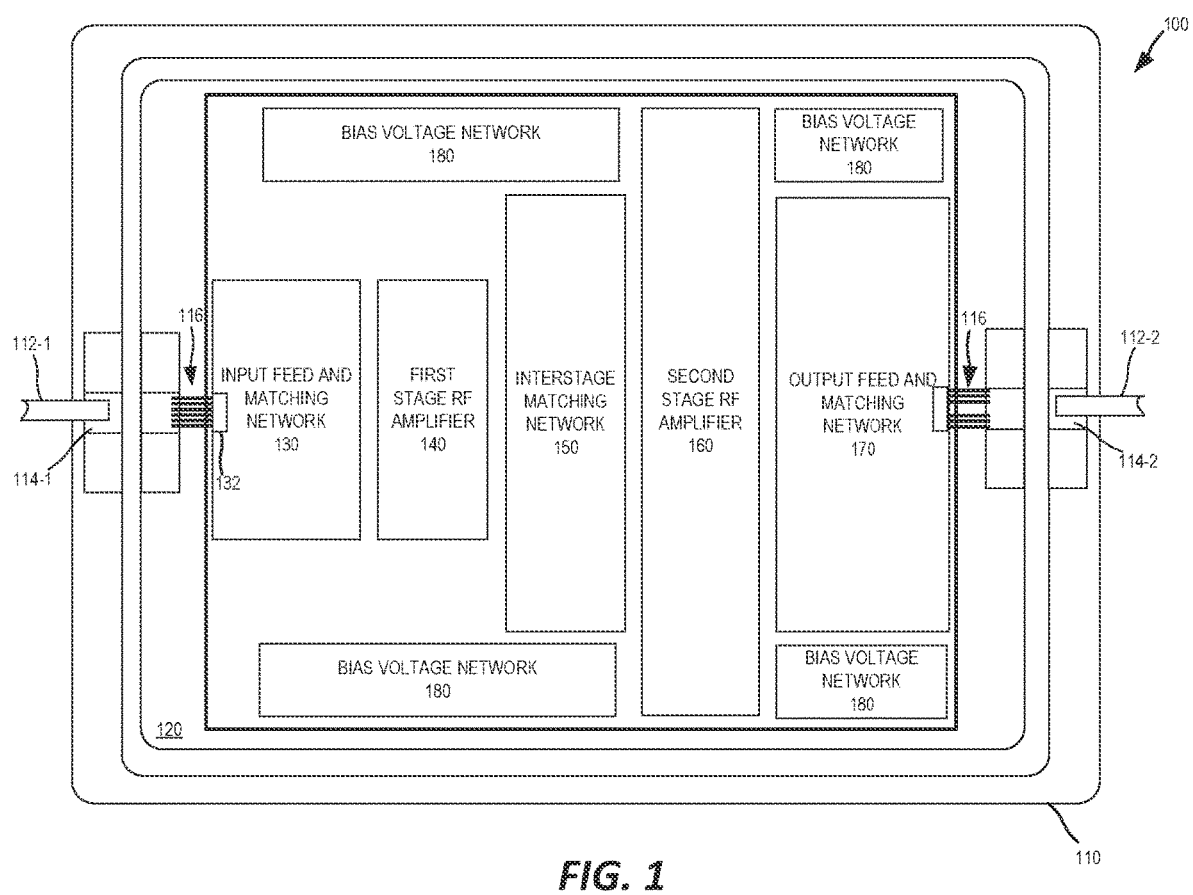
FIG. 1 is a schematic plan view of a MMIC RF transistor amplifier according to embodiments of the present invention.

Two-part reference numerals are used in some of the drawings to refer to multiple instances of like elements. Such elements may be referred to individually herein by their full reference numeral, and may be referred to collectively by the first part of their reference numeral (i.e., the part prior to the hyphen).

DETAILED DESCRIPTION

As discussed above, MIMIC RF transistor amplifiers often include an input impedance matching circuit, an output impedance matching circuit and/or one or more interstage impedance matching circuits. Such impedance matching circuits often include one or more capacitors. MMIC RF transistor amplifiers also often include an input harmonic termination circuit and/or an output harmonic termination circuit. These harmonic termination circuits may also include one or more capacitors. MMIC RF transistor amplifiers also typically include a plurality of bypass capacitors that block RF signals from passing to off-chip direct current ("DC") bias voltage sources or that block DC signals from passing along the RF signal transmission path. All of these capacitors are typically implemented as metal-insulator-metal plate capacitors. The bypass capacitors in particular may require relatively high capacitance values.

There are several ways to increase the capacitance (i.e., farads per unit area) of a plate capacitor. First, the area of the overlapping metal plates may be increased. This approach, however, increases the size of the capacitor, and hence may increase the size of the MMIC chip in which the capacitor is implemented. This increases manufacturing costs. Second, the insulator of the metal-insulator-metal capacitor may be implemented using an insulating material having a higher dielectric constant. This approach, however, typically requires additional processing steps and the use of higher costs materials, both of which may be undesirable. Third, the thickness of the insulator may be reduced. However, reducing the thickness of the insulator reduces the breakdown voltage of the capacitor, and hence this approach involves performance tradeoffs.

Pursuant to embodiments of the present invention, MMIC devices such as Group III nitride-based MMIC RF transistor amplifiers are provided that include monolithically integrated multi-layer metal-insulator-metal capacitors. The multi-layer capacitors according to embodiments of the present invention allow reducing the footprint of the capacitors (i.e., the area of the capacitor when viewed from above) by stacking multiple capacitors on top of each other in a vertical direction. In some embodiments, the capacitors can be formed as part of existing metal and dielectric layers of the RF transistor amplifier and hence the multi-layer capacitors may be formed at minimal cost. The multi-layer capacitors can be connected in parallel or series depending upon the intended application.

In some embodiments, monolithic microwave integrated circuits are provided that include a Group III nitride-based semiconductor layer structure. A first metal layer is formed directly on an upper surface of the Group III nitride-based semiconductor layer structure, or on an intervening dielectric layer, a first dielectric layer is formed directly on an upper surface of the first metal layer, and a second metal layer is formed directly on an upper surface of the first dielectric layer. The first metal layer, the first dielectric layer and the second metal layer form a first capacitor. A second dielectric layer is formed directly on an upper surface of the second metal layer, a third dielectric layer is formed directly on an upper surface of the second dielectric layer, and a third metal layer is formed directly on upper surfaces of the second and third dielectric layers. The second metal layer, the second dielectric layer and the third metal layer form a second capacitor that is stacked on top of the first capacitor.

In other embodiments, MMIC RF transistor amplifiers are provided that include a Group III nitride-based semiconductor layer structure, a first metal layer on an upper surface of the Group III nitride-based semiconductor layer structure, a first dielectric layer on an upper surface of the first metal layer, a second metal layer on an upper surface of the first dielectric layer, a second dielectric layer on an upper surface of the second metal layer, and a third metal layer on an upper surface of the second dielectric layer. A plurality of gate fingers of the RF transistor amplifier and a lower electrode of a first capacitor are part of the first metal layer, and a plurality of drain fingers of the RF transistor amplifier and an upper electrode of the first capacitor (that also serves as a lower electrode of a second capacitor) are part of the second metal layer. An upper electrode of the second capacitor is part of the third metal layer. The second capacitor is stacked on top of the first capacitor to form a multi-layer capacitor structure.

Embodiments of the present invention will now be discussed in greater detail with reference to the accompanying figures.

Figure 2:
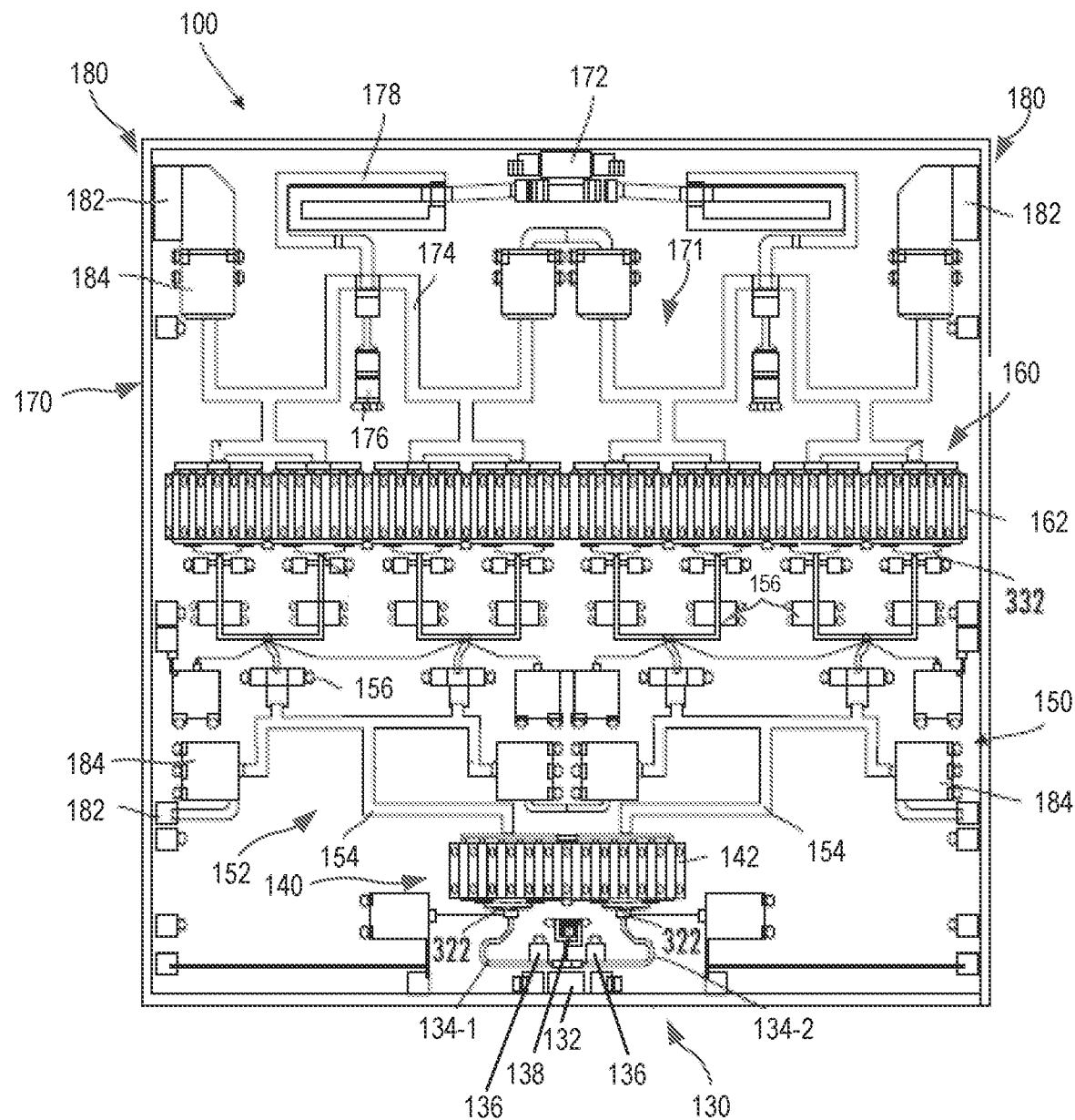
FIG. 2 is a plan view of a MMIC RF transistor amplifier according to embodiments of the present invention.
Figure 3A:
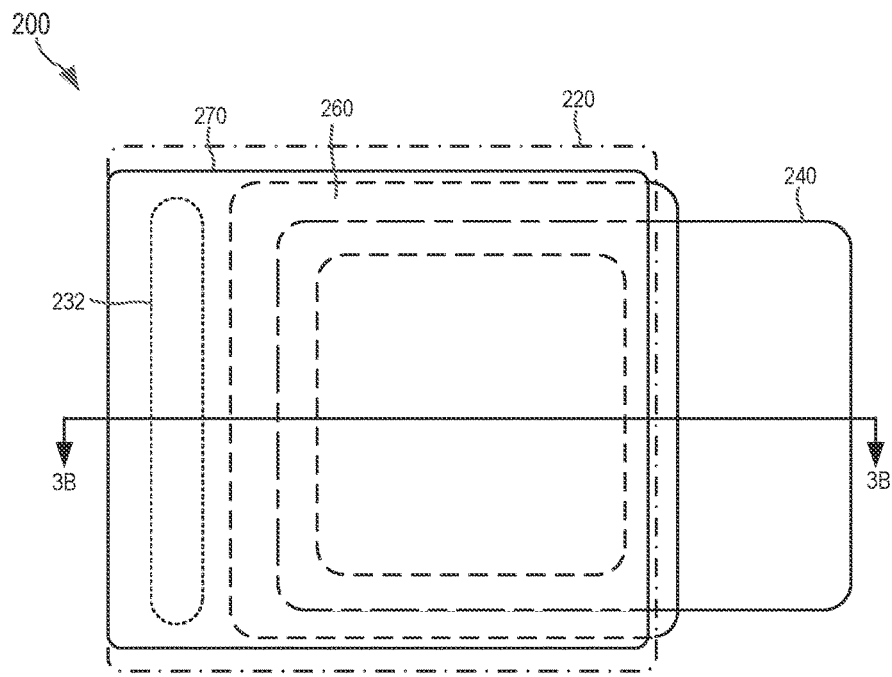
FIG. 3A is a plan view of a multi-layer capacitor according to embodiments of the present invention.
Figure 3B:
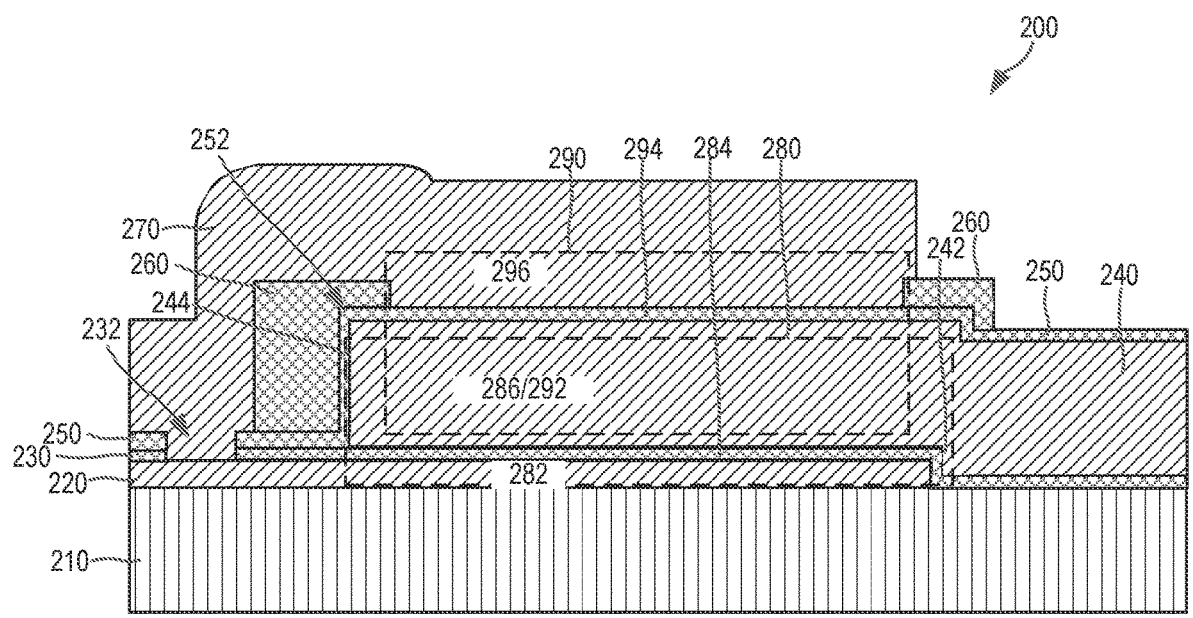
FIG. 3B is a cross-sectional view taken along line 3B-3B of FIG. 3A.
Figure 4A:
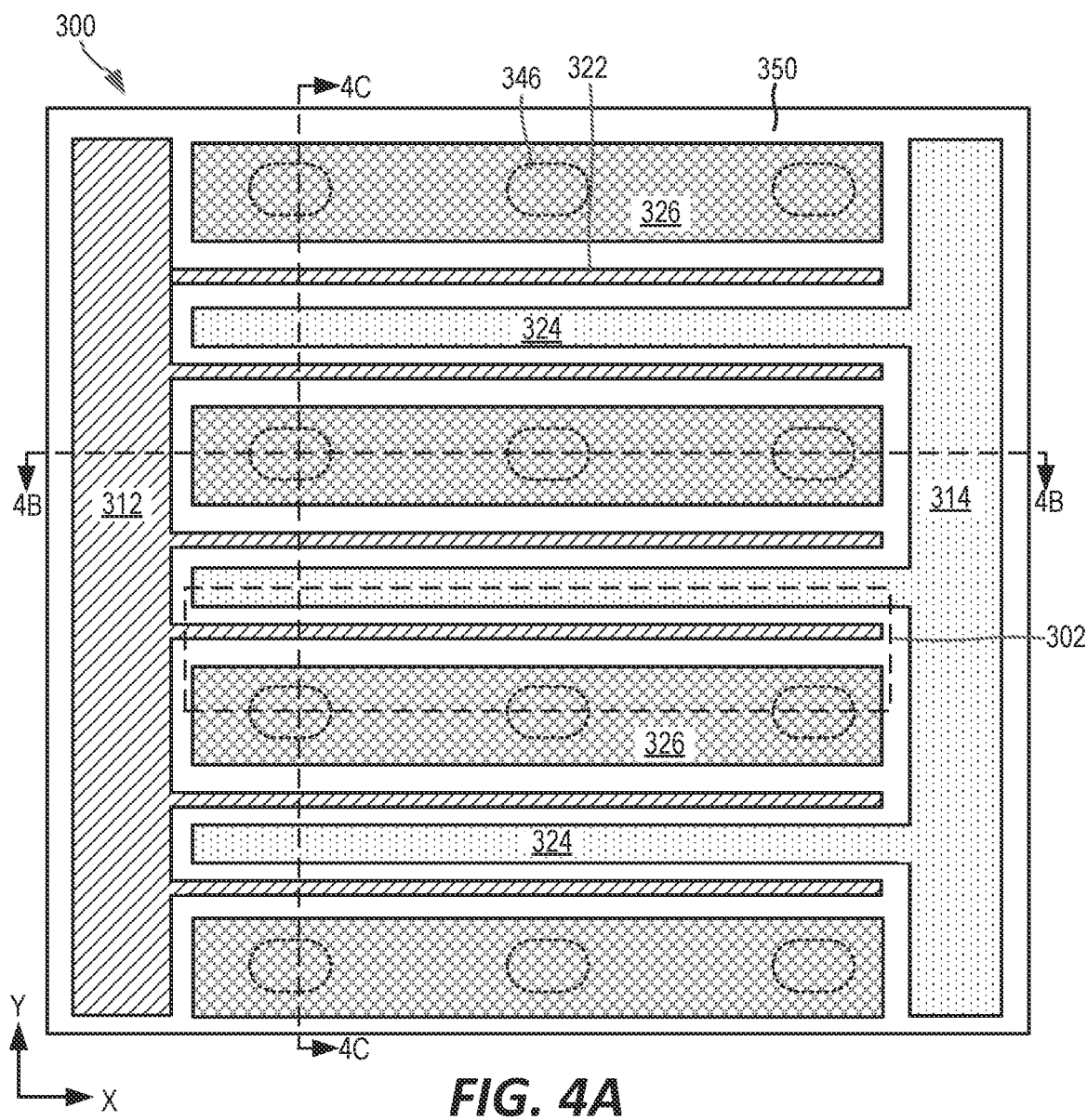
FIG. 4A is a plan view of a small portion of an amplification stage of a MMIC RF transistor amplifier.
Figure 4B:
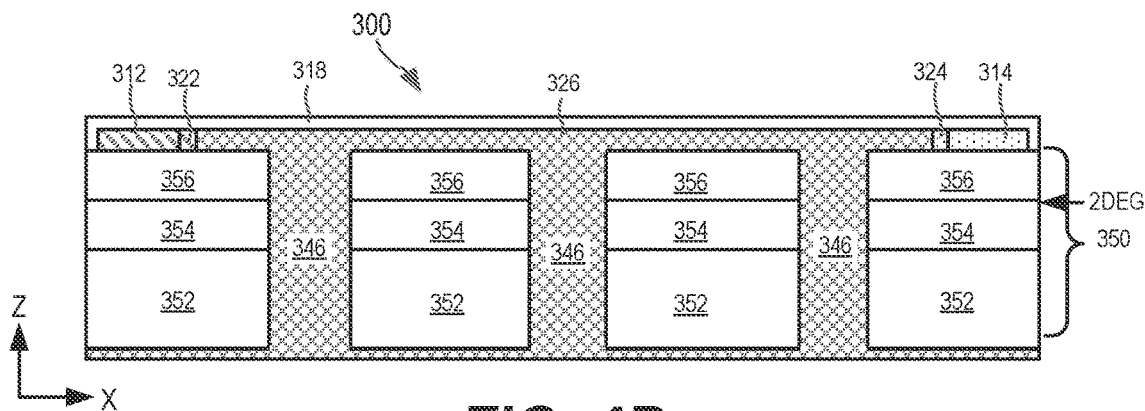
FIGS. 4B and 4C are cross-sectional views taken along lines 4B-4B and 4C-4C of FIG. 4A, respectively.

FIGS. 1-4B illustrate a packaged MMIC RF transistor amplifier 100 according to embodiments of the present invention. In particular, FIG. 1 is a schematic plan view of the packaged MMIC RF transistor amplifier 100 that illustrates the functional components of the device, while FIG. 2 is a plan view of an integrated circuit chip included in packaged MMIC RF transistor amplifier 100 with the packaging and uppermost metal and dielectric layers removed. FIGS. 4A-4C are schematic views that illustrate the structure of the first and second amplification stages of the RF transistor amplifier. Finally, FIGS. 3A and 3B are schematic plan and cross-sectional views, respectively, that illustrate the implementation of one of the capacitors (which may be, for example, one of the bypass capacitors or one of the capacitors included in the matching networks).

Referring to FIG. 1, the packaged MMIC RF transistor amplifier 100 includes an integrated circuit chip 120 that is contained within a package 110. A cover of the package 110 is omitted in FIG. 1. The package 110 may comprise a protective housing that surrounds and protects the integrated circuit chip 120. The package 110 may include a housing that is formed of, for example, a ceramic material. An input lead 112-1 and an output lead 112-2 may protrude from the housing. The input lead 112-1 may be mounted to an input lead pad 114-1 and the output lead 112-2 may be mounted to an output lead pad 114-2. For example, each lead 112 may be soldered to its associated lead pad 114. One or more bond wires 116 may electrically connect the input lead pad 114-1 to an input bond pad 132 on the integrated circuit chip 120, and one or more bond wires 116 may similarly electrically connect the output lead pad 114-2 to an output bond pad 172 on the integrated circuit chip 120.

As is further shown in FIG. 1, the integrated circuit chip 120 includes an input feed and matching network 130 (which includes the input bond pad 132), a first RF transistor amplifier stage 140, an interstage feed and matching network 150, a second RF transistor amplifier stage 160, an output feed and matching network 170 (which includes the output bond pad 172), and a bias voltage network 180.

The input feed and impedance matching network 130 includes the input bond pad 132, matching circuitry, and RF transmission lines that connect the input bond pad 132 to the first RF transistor amplifier stage 140. The matching circuitry may comprise impedance matching circuitry and/or harmonic termination circuitry, and may include one or more capacitors, inductors and/or resistors which may be electrically coupled in series and/or in parallel along the RF transmission lines.

The first RF transistor amplifier stage 140 is coupled to an output of the input feed and impedance matching network 130. The first RF transistor amplifier stage 140 may comprise, for example, a plurality of Group III nitride-based unit cell high electron mobility transistors ("HEMT") that are electrically connected in parallel.

The interstage feed and matching network 150 is coupled to the output(s) of the first RF transistor amplifier stage 140, and may include matching circuitry and RF transmission lines that connect the output(s) of the first RF transistor amplifier stage 140 to the input(s) of the second RF transistor amplifier stage 160. The matching circuitry may comprise impedance matching circuitry, and may include one or more capacitors, inductors and/or resistors which may be electrically coupled in series and/or in parallel along the RF transmission lines.

The second RF transistor amplifier stage 160 may comprise, for example, a plurality of Group III nitride-based unit cell high electron mobility transistors ("HEMT") that are electrically connected in parallel. Typically, the second RF transistor amplifier stage 160 includes more unit cell HEMT transistors than the first RF transistor amplifier stage 140.

The output feed and impedance matching network 170 includes the above-referenced output bond pad 172, matching circuitry, and RF transmission lines that connect the output(s) of the second RF transistor amplifier stage 160 to the output bond pad 172. The matching circuitry may comprise impedance matching circuitry and/or harmonic termination circuitry, and may include one or more capacitors, inductors and/or resistors which may be electrically coupled in series and/or in parallel along the RF transmission lines.

The bias voltage network 180 may comprise bias voltage input pads that may be connected (e.g., by bond wires and leads, which are not shown in FIG. 1) to external voltage sources. The bias voltage input pads may be connected to the gate, drain and source terminals of the first and second stage RF transistor amplifier stages 140, 160. Bypass capacitors that prevent the DC bias signals from coupling to the RF input or output and that block the RF signals from flowing back to the external voltage sources are coupled in series or shunt to the bias voltage input pads.

FIG. 2 is a plan view of an example implementation of the integrated circuit chip 120 of packaged MMIC RF transistor amplifier 100 of FIG. 1. In FIG. 2, the upper metal and dielectric layers are omitted to better illustrate the active electrical components of the device. As shown in FIG. 2, the input bond pad 132 of the input feed and impedance matching network 130 connects to a pair of RF transmission lines 134-1, 134-2 that connect the input bond pad 132 to gate buses (not readily visible in FIG. 2) of the first RF transistor amplifier stage 140. Impedance matching circuitry in the form of capacitors 136 and an inductor 138 are coupled to the RF transmission lines 134 and/or the input bond pad 132.

The first RF transistor amplifier stage 140 includes a plurality of Group III nitride-based unit cell HEMT transistors 142 that are electrically connected in parallel. Similarly, the second RF transistor amplifier stage 160 includes a plurality of Group III nitride-based unit cell HEMT transistors 162 that are electrically connected in parallel. The second RF transistor amplifier stage 160 includes about three times the number of unit cell HEMT transistors as compared to the first RF transistor amplifier stage 140.

The interstage feed and matching network 150 includes a corporate feed network 152 that includes a plurality of RF transmission lines 154 that electrically connect the drain buses of the HEMT transistors 142 of the first RF transistor amplifier stage 140 to the gate buses of the HEMT transistors 162 of the second RF transistor amplifier stage 160. The interstage feed and matching network 150 further includes matching circuitry in the form of a plurality of capacitors 156.

The output feed and impedance matching network 170 includes a corporate feed network 171 formed of RF transmission lines 174 that electrically connect the drain buses of the HEMT transistors 162 of the second RF transistor amplifier stage 160 to the output bond pad 172. The output feed and impedance matching network 170 further includes matching circuitry in the form of capacitors 176 and spiral inductors 178 that provide both output impedance matching and harmonic termination.

The bias voltage network 180 comprises a plurality of bias voltage input pads 182 that are primarily positioned along the sides of the integrated circuit chip 120. The bias voltage input pads 182 are connected to the gate, drain and source terminals of the first and second stage RF transistor amplifier stages 140, 160. Bypass capacitors 184 that prevent the DC bias signals from coupling to the RF input or output and that block the RF signals from flowing back to the external voltage sources are coupled in series or shunt to the bias voltage input pads 182.

As discussed above, pursuant to some embodiments of the present invention, MMIC RF transistor amplifiers are provided that implement at least some of the capacitors included in the device as multi-layer capacitors. It may be particularly advantageous, for example, to implement at least some of the bypass capacitors 184 shown in FIG. 2 as multi-layer capacitors in order to reduce the size thereof, as these capacitors tend to be large and hence increase the size of the integrated circuit chip. If the size of the integrated circuit chip can be reduced, then more integrated circuit chips can be fabricated on a single semiconductor wafer, thereby reducing manufacturing costs. Smaller chips also allow for the use of smaller packages, further reducing manufacturing costs. FIGS. 3A and 3B illustrate one example implementation of a multi-layer capacitor structure 200 that can be used to implement some or all of the capacitors illustrated in FIG. 2. FIG. 3A is a plan view of selected layers the capacitor structure 200, while FIG. 3B is a cross-sectional view taken along line 3B-3B of FIG. 3A. Note that in FIG. 3A dashed and dotted lines are used to illustrate portions of various layers that are covered by other layers, and that only one of the dielectric layers is shown. It will be appreciated that FIGS. 3A and 3B only show small portions of the various metal and dielectric layers, and that other portions of illustrated layers may be used, for example, to form additional capacitors, matching circuitry and selected structures of RF transistor amplifiers that are included in the same integrated circuit.

As shown in FIGS. 3A-3B, the capacitor structure 200 is formed on a Group III nitride-based semiconductor layer structure 210 (FIG. 3B). The Group III nitride-based semiconductor layer structure 210 may comprise, for example, a silicon carbide substrate having a plurality of gallium nitride based semiconductor layers (e.g., epitaxial grown layers) on an upper surface thereof. The Group III nitride-based semiconductor layer structure 210 is only illustrated in the cross-sectional view of FIG. 3B.

A first metal layer 220 may be formed on the Group III nitride-based semiconductor layer structure 210. A first dielectric layer 230 (only shown in FIG. 3B) is formed on an upper surface of the first metal layer 220. The first dielectric layer 230 may comprise, for example, a silicon nitride layer or a silicon oxynitride layer in example embodiments. The first dielectric layer 230 may be formed conformally directly on the first metal layer 220. A second metal layer 240 is formed on an upper surface of the first dielectric layer 230. The second metal layer 240 may be formed directly on the first dielectric layer 230. The first dielectric layer 230 may electrically insulate the first metal layer 220 from the second metal layer 240.

A second dielectric layer 250 (only shown in FIG. 3B) is formed on an upper surface of the second metal layer 240. The second dielectric layer 250 may comprise, for example, a silicon nitride layer or a silicon oxynitride layer in example embodiments, and may be formed of the same material as the first dielectric layer 230 or formed of a different material. The second dielectric layer 250 may be formed conformally directly on the second metal layer 240. The second dielectric layer 250 may also extend onto one or more sidewalls 242 of the second metal layer 240, and may be formed on an upper surface of the first dielectric layer 230 in selected locations. The first and second dielectric layers 230, 250 may have different thicknesses.

A third dielectric layer 260 in the form of a dielectric crossover 260 may be formed on the upper surface of the second dielectric layer 250. The third dielectric layer/dielectric crossover 260 may comprise a ring shaped structure that has an open center when viewed from above. The dielectric crossover 260 may extend onto side surfaces of the second dielectric layer 250. The dielectric crossover 260 may be formed of, for example, silicon nitride. In the depicted embodiment, the dielectric crossover 260 has a rectangular ring shape as can best be seen in FIG. 3A. The second dielectric layer 250 and the dielectric crossover 260 may both cover upper edges of the second metal layer 240 A third metal layer 270 is formed on upper surfaces of the second metal layer 240, the second dielectric layer 250 and the dielectric crossover 260.

The first metal layer 220, the first dielectric layer 230 and the second metal layer 240 form a first capacitor 280 of the capacitor structure 200. In particular, the portion of the first metal layer 220 that vertically overlaps the second metal layer forms a lower electrode 282 of the first capacitor 280, the portion of the first dielectric layer 230 that vertically overlaps both the first and second metal layers 220, 240 forms a dielectric layer 284 of the first capacitor 280, and the portion of second metal layer 240 that vertically overlaps the first metal layer 220 forms an upper electrode 286 of the first capacitor 280. Note that in the depicted embodiment a small portion 242 of the second metal layer 240 that is adjacent a sidewall of the first metal layer 220 will also act as part of the upper electrode 286 of the first capacitor 280.

The second metal layer 240, the second dielectric layer 250 and the third metal layer 270 form a second capacitor 290 of the capacitor structure 200. In particular, the portion of the second metal layer 240 that vertically overlaps the third metal layer 270 and that does not vertically overlap the dielectric crossover 260 forms a lower electrode 292 of the second capacitor 290, the portion of the second dielectric layer 250 that vertically overlaps the lower electrode 292 and that does not vertically overlap the dielectric crossover 260 forms a dielectric layer 294 of the second capacitor 290, and the portion of the third metal layer 270 that vertically overlaps the second metal layer 240 and that does not vertically overlap the dielectric crossover 260 forms an upper electrode 296 of the second capacitor 290. The third metal layer 270 fills a central opening in the dielectric crossover 260. This opening defines a surface area of the second capacitor 290.

The dielectric crossover 260 defines the size of the second capacitor 290. In particular, since the dielectric crossover significantly increases the thickness of the dielectric layer interposed between the second and third metal layers 240, 270, the dielectric crossover 260 ensures that portions of the third metal layer 270 that vertically overlap the second metal layer 240 that also vertically overlap the dielectric crossover 260 will have at most a minimal contribution to the capacitance of the second capacitor 290. The dielectric crossover 260 likewise ensures that the portion of the third metal layer 270 that is adjacent the sidewall 244 of the second metal layer 240 will likewise have at most a minimal contribution to the capacitance of the second capacitor 290. The dielectric crossover 260 may also reduce the possibility that the second dielectric layer 250 experiences breakdown in the "corner regions" 252 where the second dielectric layer 250 covers the upper edges of the second metal layer 240, as electric fields may be higher in these regions and hence contribute more heavily to breakdown of the second dielectric layer 250 in these corner regions 252. The metal of both the second metal layer 240 and/or the third metal layer 270 adjacent these corner regions 252 may also experience higher levels of fatigue, which can lead to micro-cracks in the metal. The presence of the dielectric crossover 260 may help block diffusion paths into such micro-cracks.

As is also shown in FIGS. 3A-3B, overlapping portions of the first and second dielectric layers 230, 250 may be omitted (e.g., by a patterned deposition process or by a blanket deposition process followed by an etching process) to form an opening 232 through the first and second dielectric layers 230, 250. The third metal layer 270 may be deposited within this opening 232 so that the third metal layer 270 electrically connects to the first metal layer 220. As will be discussed below with reference to FIG. 5A, this electrical connection may be used to electrically connect the first and second capacitors 280, 290 in parallel. In other embodiments, this electrical connection may be omitted so that the first and second capacitors 280, 290 are electrically connected in series.

It can also be seen from FIG. 3B that the first dielectric layer 230, the second dielectric layer 250 and the dielectric crossover 260 may be directly stacked on one another along a vertical axis adjacent the sidewall 244 of the second metal layer 240.

The second and third metal layers 240, 270 may be used to form other components of the matching networks. For example, inductors of the matching networks may be formed in whole or in part in the second and third metal layers 240, 270, as can transmission lines of the input and/or output feed networks that are part of the input feed and matching network 130 and/or the output feed and matching network 170.

Figure 4C:
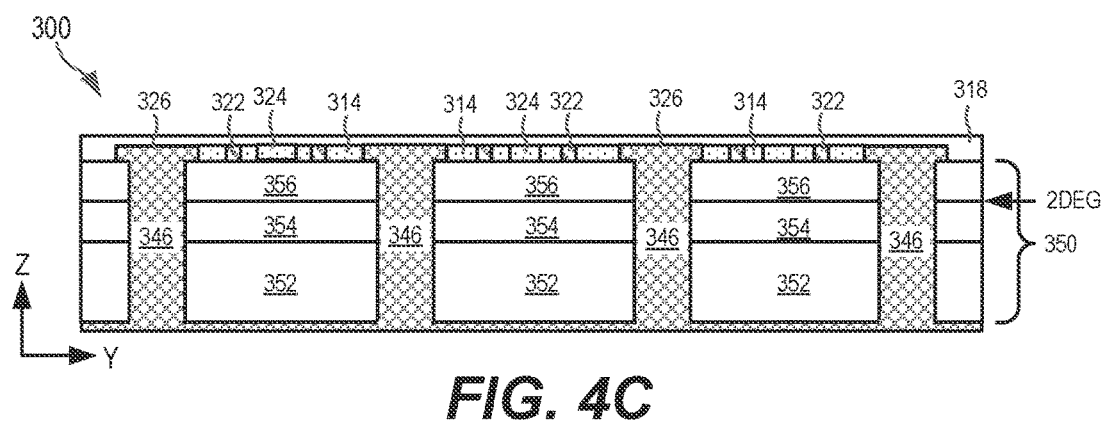

As discussed above, in some embodiments of the present invention, multi-layer capacitors may be formed in MIMIC RF transistor amplifiers using the metal and dielectric layers that are already used to form the RF transistor amplifier. FIGS. 4A-4C illustrate a small portion of the RF transistor amplifier circuit of such a MIMIC RF transistor amplifier and also show how the same metal and dielectric layers may be used to form both the RF transistor amplifier circuit and multi-layer capacitors that are implemented in other portions of the MIMIC device.

In particular, FIG. 4A is a schematic plan view of a small portion of an RF transistor amplifier stage 300 of the packaged MMIC RF transistor amplifier 100 of FIG. 1. Both the first and second RF transistor amplifier stages 140, 160 shown in FIGS. 1 and 2 above can be implemented as shown in FIG. 4A. It should be noted that in FIG. 4A, the upper surface of the semiconductor layer structure as well as first and second metal layers are shown, but other (higher) metal layers and dielectric layers are omitted from view so that only the metallization that directly contacts the semiconductor layer structure is shown. FIGS. 4B and 4C are schematic cross-sectional views taken along lines 4B-4B and 4C-4C of FIG. 4A, respectively.

As shown in FIG. 4A, the RF transistor amplifier stage 300 includes a gate bus 312 and a drain bus 314, a plurality of gate fingers 322, a plurality of drain fingers 324 and a plurality of source fingers 326, all of which are formed on an upper surface of a semiconductor layer structure 350. The semiconductor layer structure 350 may comprise, for example, a plurality of Group III nitride-based semiconductor layers that are formed on an upper surface of a silicon carbide substrate.

The gate fingers 322, drain fingers 324 and source fingers 326 may extend in parallel to each other, with the gate fingers 322 extending from the gate bus 312 in a first direction and the drain fingers 324 extending from the drain bus 314 in a direction opposite the first direction. Each gate finger 322 may be positioned between a drain finger 314 and a source finger 326. The gate bus 312 and the gate fingers 322 may be implemented in a first metal layer. This first metal layer may be the same metal layer as the first metal layer 220 that is used to form the lower electrode 282 of the first capacitor of 280 of capacitor structure 200. The first metal layer 220 may be formed of materials that are capable of making a Schottky contact to a Group III nitride-based semiconductor material, such as Ni, Pt, Cu, Pd, Cr, W and/or WSiN so that the gate fingers will form a Schottky contact with the semiconductor layer structure 350.

The drain bus 314 and the drain fingers 324 may be implemented in a second metal layer. This second metal layer may be the same metal layer as the second metal layer 240 that is used to form the upper electrode 286 of the first capacitor of 280 of capacitor structure 200 (which also acts as the lower electrode 292 of the second capacitor 290 of capacitor structure 200). The drain fingers 324 may include a metal, such as TiAlN, TiSiNi and/or TiPtAu that can form an ohmic contact to Group III nitride-based materials.

The source fingers 326 may also be implemented in the second metal layer 240. The source fingers 326 are physically and electrically connected to a source terminal (not shown) of the RF transistor amplifier stage 300 that is located on the bottom side of the semiconductor layer structure 350 by a plurality of metal-plated or metal-filled source vias 346 that extend through the semiconductor layer structure 350. One or more interlayer insulating layers 318 (see FIG. 4B) are formed that isolate the gate metallization 312, 322, the drain metallization 314, 324 and the source metallization 326 from each other. The interlayer insulating layer(s) 318 may include a dielectric material, such as SiN, $SiO_2$, etc.

The RF transistor amplifier stage 300 includes a plurality of unit cell transistors 302, one of which is indicated in the dashed box in FIG. 4A. The unit cell transistor 302 includes a gate finger 322, a portion of a drain finger 324 and a portion of a source finger 326 along with the portions of the semiconductor layer structure 350 underlying the identified gate finger 322, drain finger 324 and source finger 326. Since all of the gate fingers 322 are electrically connected to a common gate bus 312, all of the drain fingers 324 are electrically connected to a common drain bus 314, and all of the source fingers 326 are electrically connected to a common source terminal, it can be seen that the unit cell transistors 302 are all electrically connected together in parallel.

The RF transistor amplifier stage 300 may comprise a Group III nitride-based HEMT RF transistor amplifier. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses,"

published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

FIGS. 4B and 4C illustrate the semiconductor layer structure 350 in more detail. As shown in FIGS. 4B and 4C, the semiconductor layer structure 350 includes a plurality of semiconductor layers. In the depicted embodiment, a total of two semiconductor layers are shown, namely a channel layer 354 and a barrier layer 356 that is on a top side of the channel layer 354. The semiconductor layer structure 350 may (and typically will) include additional semiconductor and/or non-semiconductor layers. For example, the semiconductor layer structure 350 may include a growth substrate 352 on which the other semiconductor layers are grown. The growth substrate 352 may comprise, for example, a 4H-SiC or 6H-SiC substrate. In other embodiments, the growth substrate 352 may be comprise a different semiconductor material (e.g., silicon or a Group III nitride-based material, GaAs, ZnO, InP) or a non-semiconductor material (e.g., sapphire). The growth substrate 352, even if formed of a non-semiconductor material, is considered to be part of the semiconductor layer structure 350.

Optional buffer, nucleation and/or transition layers (not shown) may be provided on the growth substrate 352 beneath the channel layer 354. For example, an AlN buffer layer may be included to provide an appropriate crystal structure transition between a SiC growth substrate 352 and the remainder of the semiconductor layer structure 350. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

In some embodiments, the channel layer 354 is a Group III nitride material, such as $Al_xGa_{1-x}N$ where $0 \leq x < 1$, provided that the energy of the conduction band edge of the channel layer 354 is less than the energy of the conduction band edge of the barrier layer 356 at the interface between the channel and barrier layers 354, 356. In certain embodiments of the present invention, x=0, indicating that the channel layer 354 is gallium nitride ("GaN"). The channel layer 354 may also be other Group III nitrides such as InGaN, AlInGaN or the like. The channel layer 354 may be undoped or unintentionally doped and may be grown to a thickness of, for example, greater than about 20 Å. The channel layer 354 may also be a multi-layer structure, such as a superlattice or combinations of GaN, AlGaN or the like.

The channel layer 354 may have a bandgap that is less than the bandgap of at least a portion of the barrier layer 356, and the channel layer 354 may also have a larger electron affinity than the barrier layer 356. The barrier layer 356 may be a Group III nitride and may have a bandgap larger than that of the channel layer 354. In particular embodiments, the barrier layer 356 is thick enough and has a high enough Al composition and doping to induce a significant carrier concentration at the interface between the channel layer 354 and the barrier layer 356. In certain embodiments of the present invention, the barrier layer 356 may include AlGaN, AlInGaN and/or AlN or combinations of layers thereof. The barrier layer 356 may, for example, be from about 0.1 nm to about 30 nm thick. In certain embodiments, the barrier layer 356 is undoped or doped with an n-type dopant to a concentration less than about $10^{19}$ $cm^{-3}$. In some embodiments of the present invention, the barrier layer 356 is $Al_xGa_{1-x}N$ where $0<x<1$. In particular embodiments, the aluminum concentration is about 25%. However, in other embodiments of the present invention, the barrier layer 356 comprises AlGaN with an aluminum concentration of between about 5% and about 100%. In specific embodiments of the present invention, the aluminum concentration is greater than about 10%.

Due to the difference in bandgap between the barrier layer 356 and the channel layer 354 and piezoelectric effects at the interface between the barrier layer 356 and the channel layer 354, a two dimensional electron gas (2DEG) is induced in the channel layer 354 at a junction between the channel layer 354 and the barrier layer 356. The 2DEG acts as a highly conductive layer that allows conduction between the source region of each unit cell transistor 302 and its associated drain region, where the source region is the portion of the semiconductor layer structure 350 that is directly underneath the source finger 326 and the drain region is the portion of the semiconductor layer structure 350 that is directly underneath the corresponding drain finger 324.

Figure 5A:
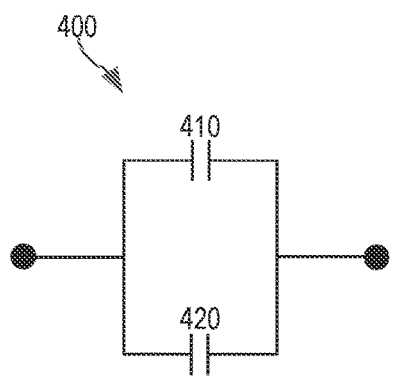
FIG. 5A is a circuit diagram illustrating a parallel implementation of the multi-layer capacitors according to embodiments of the present invention.
Figure 5B:
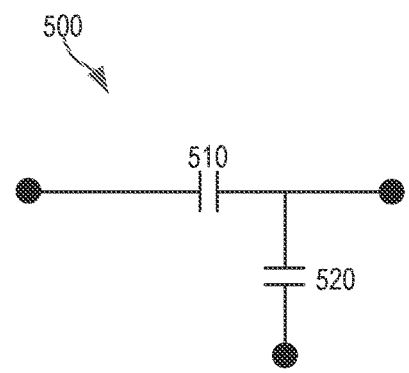
FIG. 5B is a circuit diagram illustrating a series implementation of the multi-layer capacitors according to embodiments of the present invention.

As discussed above, the multi-layer capacitors according to embodiments of the present invention may be configured in different ways. FIGS. 5A and 5B are circuit diagrams of two potential configurations.

Referring first to FIG. 5A, a multi-layer capacitor 400 is illustrated that includes first and second capacitors 410, 420 that are electrically connected in parallel. The capacitance of multi-layer capacitor 400 is equal to the sum of the capacitances of the first and second capacitors 410, 420. Since the first and second capacitors 410, 420 are vertically stacked, approximately twice the capacitance can be obtained for a given amount of "real estate" in the semiconductor die as compared to a conventional single layer capacitor. Moreover, since the multi-layer capacitor can be formed using the same metal and dielectric layers that are used to form other portions of the device, the reduced footprint can be obtained at little or no additional cost. The bypass capacitors 184 and/or the capacitors 136, 156, 176 included in the matching networks of packaged MMIC RF transistor amplifier 100 can have the configuration shown in FIG. 5A. As discussed above, the electrical connection 430 between the first and second capacitors can be formed by forming an opening 232 in the first and second dielectric layers 230, 250 that is used to form the respective first and second capacitors 280, 290 so that the third metal layer 270 may directly contact the first metal layer 220.

Referring to FIG. 5B, a multilayer capacitor 500 is illustrated that includes first and second capacitors 510, 520 that are electrically connected in series. Certain of the capacitors 136, 156, 176 included in the matching networks of packaged MMIC RF transistor amplifier 100 can have the configuration shown in FIG. 5B. The configuration shown in FIG. 5B may also be used to implement AC voltage dividers.

Figure 6A:
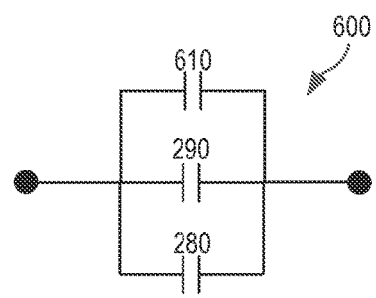
FIG. 6A is a circuit diagram illustrating a parallel implementation of a three capacitor multi-layer capacitor according to embodiments of the present invention.
Figure 6B:
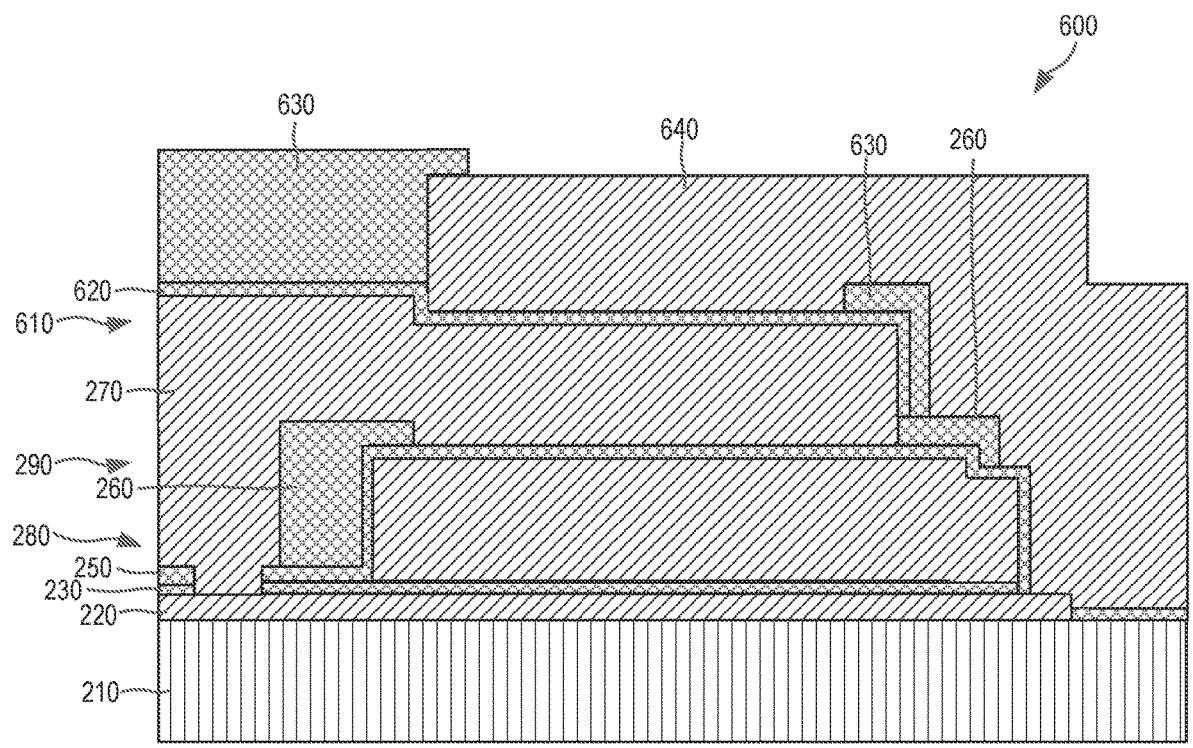
FIG. 6B is a schematic cross-sectional view of an implementation of the multi-layer capacitor of FIG. 6A.

It will also be appreciated that the multi-layer capacitors according to embodiments of the present invention may include more than two vertically-stacked capacitors. For example, FIG. 6A is a circuit diagram of a multi-layer capacitor 600 according to embodiments of the present invention that includes first through third vertically stacked capacitors 280, 290, 610. FIG. 6B is a schematic cross-sectional view of multi-layer capacitor 600. As shown, multilayer capacitor 600 may be formed by adding a fourth dielectric layer 620, a fifth dielectric layer in the form of a dielectric crossover 630, and a fourth metal layer 640 to the multi-layer capacitor 200 of FIGS. 3A-3B. The fourth metal layer 640 is electrically connected to the first metal layer 220 so that the three capacitors are electrically connected in parallel.

The multi-layer capacitors according to embodiments of the present invention may also be used in MMIC RF transistor amplifiers that include gate jumpers that run at a higher level in the device than the gate fingers, and that electrically connect the gate bus to one or more intermediate positions along the gate fingers. U.S. Pat. No. 9,947,616 ("the '616 patent") describes a wide variety of RF transistor amplifiers that include such gate jumpers. The entire content of the '616 patent is incorporated herein by reference. In some embodiments, the gate jumper may be formed in the third metal layer (i.e., the metal layer that includes the upper electrode of the second capacitor) in the embodiments discussed above.

The RF transistor amplifiers described above can be used as standalone RF transistor amplifiers. They may also be used in various applications that include multiple RF transistor amplifiers. Examples of how the RF transistor amplifiers according to embodiments of the present invention may be used in applications that include multiple amplifiers will be discussed with reference to FIGS. 7A and 7B.

Figure 7A:
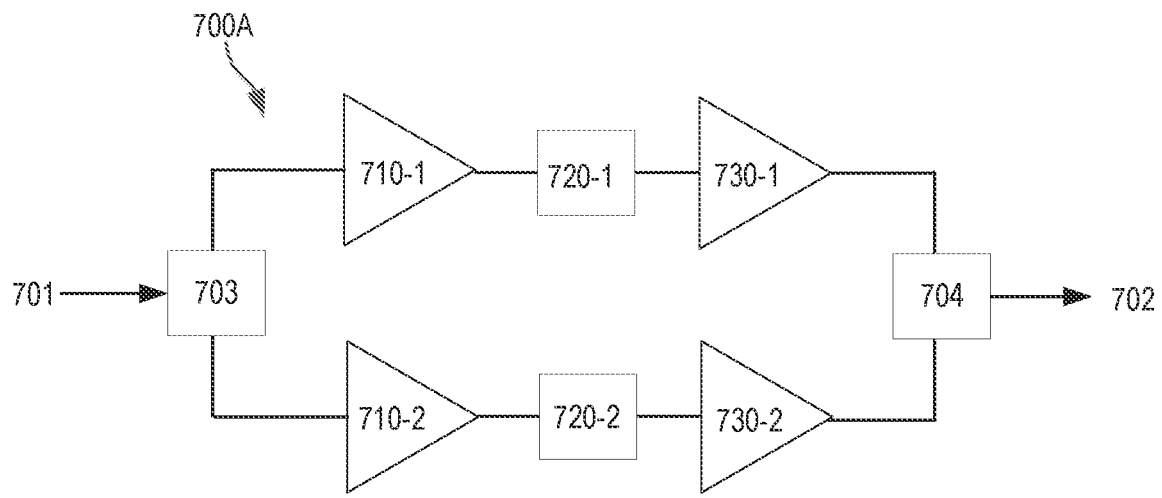
FIGS. 7A and 7B are schematic block diagrams of multi-amplifier circuits MIMIC RF transistor amplifiers having different configurations of amplification stages according to embodiments of the present invention.

Referring first to FIG. 7A, a MMIC RF transistor amplifier 700A is schematically illustrated that includes an RF input 701, a pair of pre-amplifiers 710-1, 710-2, a pair of inter-stage impedance matching networks 720-1, 720-2, a pair of main amplifiers 730-1, 730-2, and an RF output 702. A splitter 703 and a combiner 704 are also provided. Pre-amplifier 710-1 and main amplifier 730-1 (which are electrically connected in series) are arranged electrically in parallel with pre-amplifier 710-2 and main amplifier 730-2 (which are electrically connected in series). While not shown in FIG. 7A, MMIC RF transistor amplifier 700A may further include an input matching network that is interposed between RF input 701 and pre-amplifier 710, and/or an output matching network that is interposed between the main amplifier 730 and the RF output 702. Any of the capacitors included in MMIC RF transistor amplifier 700A may be implemented as the multi-layer capacitors according to embodiments of the present invention, and may be implemented using the same metal and dielectric layers that are used to implement the RF amplification stages in the same manner discussed above.

Figure 7B:
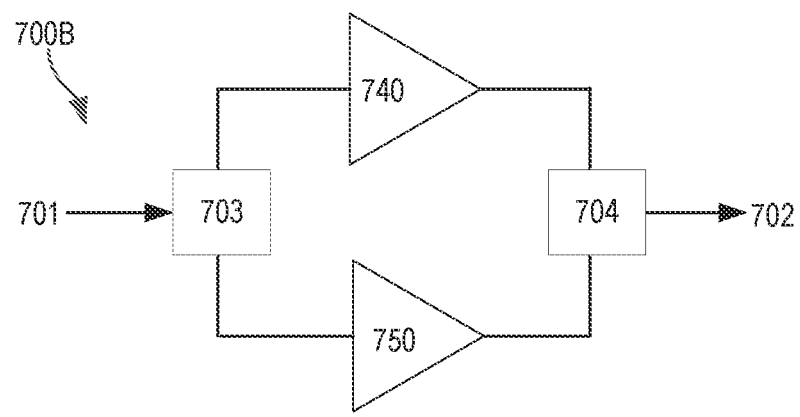

As shown in FIG. 7B, the MMIC RF transistor amplifiers according to embodiments of the present invention may also be Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 7B, the Doherty RF transistor amplifier 700B includes an RF input 701, an input splitter 703, a main amplifier 740, a peaking amplifier 750, an output combiner 704 and an RF output 702. The Doherty RF transistor amplifier 700B may optionally include input matching networks and/or an output matching networks (not shown). Any of the capacitors included in MMIC RF transistor amplifier 700B may be implemented as the multi-layer capacitors according to embodiments of the present invention, and may be implemented using the same metal and dielectric layers that are used to implement the RF amplification stages in the same manner discussed above.

The MIMIC RF transistor amplifiers according to embodiments of the present invention may be designed to operate in a wide variety of different frequency bands. In some embodiments, the RF transistor amplifiers may be configured to operate at frequencies greater than 1 GHz. In other embodiments, these RF transistor amplifier dies may be configured to operate at frequencies greater than 2.5 GHz. In still other embodiments, the RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the present invention have been discussed above with respect to a RF transistor amplifier dies that are implemented using HEMT devices, it will be understood that other types of semiconductor devices may be formed in the semiconductor layer structure without deviating from the present invention. For example, the semiconductor layer structure may include a MOSFET, a DMOS transistor, a MESFET, and/or an LDMOS transistor in other embodiments.

While the above discussion focuses primarily on MMIC RF transistor amplifiers, it will be appreciated that the multi-layer capacitors according to embodiments of the present invention may be used in other devices, such as MMIC RF switches.

Embodiments of the present inventive concepts have been described above with reference to the accompanying drawings, in which embodiments of the invention are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Herein, two elements of a semiconductor device (e.g., a MMIC RF Transistor amplifier) "vertically overlap" if an axis that is perpendicular to a major surface of a semiconductor layer structure of the device intersects both elements.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:
   a Group III nitride based semiconductor layer structure;
   a first metal layer that is directly on an upper surface of the Group III nitride based semiconductor layer structure;
   a first dielectric layer that is directly on an upper surface of the first metal layer;
   a second metal layer that is directly on an upper surface of the first dielectric layer;
   a second dielectric layer that is directly on an upper surface of the second metal layer;
   a third dielectric layer that is on an upper surface of the second dielectric layer;
   a third metal layer that is directly on an upper surface of the second dielectric layer and directly on an upper surface of the third dielectric layer, wherein the first metal layer, the first dielectric layer and the second metal layer form a first capacitor, and the second metal layer, the second dielectric layer and the third metal layer form a second capacitor that is stacked on top of the first capacitor.

2. The semiconductor device of claim 1, wherein the third metal layer fills an opening in the third dielectric layer, the opening defining a surface area of the second capacitor.

3. The semiconductor device of claim 1, wherein the third dielectric layer further extends onto side surfaces of the second dielectric layer.

4. The semiconductor device of claim 1, wherein the second dielectric layer and the third dielectric layer both cover an upper edge of the second metal layer.

5. The semiconductor device of claim 1, further comprising an electrical connection between the first metal layer and the third metal layer that connects the first capacitor and the second capacitor in parallel.

6. The semiconductor device of claim 1, wherein a thickness of a portion of the first dielectric layer that is part of the first capacitor differs from a thickness of portion of the second dielectric layer that is part of the second capacitor.

7. The semiconductor device of claim 1, wherein the semiconductor device is a monolithic microwave integrated circuit that includes a planar radio frequency ("RF") transistor amplifier and a matching circuit, wherein gate fingers and a gate bus of the RF transistor amplifier are part of the first metal layer, wherein drain fingers and a drain bus of the RF transistor amplifier are part of the second metal layer and wherein source fingers of the RF transistor amplifier are also part of the second metal layer.

8. The semiconductor device of claim 7, wherein at least one inductor of the matching circuit is part of the second metal layer, wherein an input feed network for the RF transistor amplifier is part of the second metal layer, and wherein a gate jumper of the RF transistor amplifier is part of the third metal layer.

9. The semiconductor device of claim 1, further comprising a fourth dielectric layer directly on an upper surface of the third metal layer and a fourth metal layer that is directly on an upper surface of the fourth dielectric layer, wherein the third metal layer, the fourth dielectric layer and the fourth metal layer form a third capacitor that is stacked on top of the second capacitor.

10. The semiconductor device of claim 1, wherein the first metal layer is directly on an upper surface of the Group III nitride semiconductor layer structure, and wherein the first metal layer and the second metal layer include different compositions of one or more metals.

11. A radio frequency ("RF") transistor amplifier, comprising:
   a Group III nitride based semiconductor layer structure;
   a first metal layer that is on an upper surface of the Group III nitride based semiconductor layer structure, wherein a plurality of gate fingers of the RF transistor amplifier and a lower electrode of a first capacitor are part of the first metal layer;
   a first dielectric layer that is directly on an upper surface of the first metal layer;
   a second metal layer that is directly on an upper surface of the first dielectric layer, wherein a plurality of drain fingers of the RF transistor amplifier and an upper electrode of the first capacitor that also serves as a lower electrode of a second capacitor are part of the second metal layer;
   a second dielectric layer that is directly on an upper surface of the second metal layer; and
   a third metal layer that is directly on an upper surface of the second dielectric layer, wherein an upper electrode of the second capacitor is part of the third metal layer, wherein the second capacitor is stacked on top of the first capacitor to form a multi-layer capacitor structure.

12. The RF transistor amplifier of claim 11, wherein the first metal layer and the second metal layer include different compositions of one or more metals.

13. The RF transistor amplifier of claim 11, wherein source fingers of the RF transistor amplifier are also part of the second metal layer.

14. The RF transistor amplifier of claim 13, further comprising a matching circuit, wherein at least one inductor of the matching circuit is part of the second metal layer.

15. The RF transistor amplifier of claim 14, wherein an input feed network for the RF transistor amplifier is part of the second metal layer, and wherein a gate jumper of the RF transistor amplifier is part of the third metal layer.

16. The RF transistor amplifier of claim 11, further comprising a third dielectric layer that is formed directly on an upper surface and a side surface of the second dielectric layer, the third dielectric layer including an opening that defines a surface area of the second capacitor, wherein the third metal layer fills the opening in the third dielectric layer.

17. The RF transistor amplifier of claim 16, wherein the second dielectric layer and the third dielectric layer both cover an upper edge of the second metal layer.

18. The RF transistor amplifier of claim 11, further comprising an electrical connection between the first metal layer and the third metal layer that connects the first capacitor and the second capacitor in parallel.

19. The RF transistor amplifier of claim 18, wherein the electrical connection between the first metal layer and the third metal layer comprises a first opening in the first dielectric layer and a second opening in the second dielectric layer that vertically overlaps the first opening, wherein the third metal layer extends through the first and second openings to contact the first metal layer.

20. A semiconductor device, comprising:
a first metal layer that is on an upper surface of the Group III nitride based semiconductor layer structure, wherein a lower electrode of a first capacitor is part of the first metal layer;
a first dielectric layer that is directly on an upper surface of the first metal layer;
a second metal layer that is directly on an upper surface of the first dielectric layer, wherein an upper electrode of the first capacitor that also serves as a lower electrode of the second capacitor is part of the second metal layer;
a second dielectric layer that is directly on an upper surface of the second metal layer, the second dielectric layer having a stepped upper surface and at least one sidewall connecting adjacent portions of the stepped upper surface;
a third dielectric layer directly on the sidewall of the second dielectric layer;
a third metal layer that is directly on an upper surface of the second dielectric layer and directly on an upper surface of the third dielectric layer, wherein an upper electrode of the second capacitor is part of the third metal layer,
wherein the third dielectric layer is stacked directly on the upper surface of the second dielectric layer and the second dielectric layer is stacked directly on the upper surface of the first dielectric layer adjacent a sidewall of the second metal layer.

21. The semiconductor device of claim 1, wherein the third dielectric layer covers an upper surface of the first metal layer.

* * * * *